US008717024B2

(12) United States Patent
King et al.

(10) Patent No.: US 8,717,024 B2
(45) Date of Patent: May 6, 2014

(54) SYSTEM AND METHOD FOR GENERATING A MAGNETIC RESONANCE IMAGE USING COMPRESSED SENSING AND PARALLEL IMAGING

(75) Inventors: Kevin F. King, Menomonee Falls, WI (US); Dan Xu, Oconomowoc, WI (US)

(73) Assignee: General Electric Company, Schenectady, NY (US)

( * ) Notice: Subject to any disclaimer, the term of this patent is extended or adjusted under 35 U.S.C. 154(b) by 331 days.

(21) Appl. No.: 13/342,857

(22) Filed: Jan. 3, 2012

(65) Prior Publication Data

US 2012/0169338 A1 Jul. 5, 2012

Related U.S. Application Data

(60) Provisional application No. 61/428,959, filed on Dec. 31, 2010.

(51) Int. Cl.
*G01R 33/44* (2006.01)

(52) U.S. Cl.
USPC .......................................... 324/309; 324/307

(58) Field of Classification Search
CPC ............................ G01R 33/5611; G01R 33/12
USPC ................................................. 324/300–322
See application file for complete search history.

(56) References Cited

U.S. PATENT DOCUMENTS

2009/0278539 A1* 11/2009 Beatty ............................ 324/312
2010/0308824 A1* 12/2010 Grady et al. ................... 324/309
2011/0006768 A1* 1/2011 Ying et al. ..................... 324/309
2012/0081114 A1* 4/2012 Weller et al. .................. 324/309
2013/0099786 A1* 4/2013 Huang et al. .................. 324/309

OTHER PUBLICATIONS

Liang, D., et al. "Accelerating SENSE using distributed compressed sensing." Proc Intl Soc Mag Reson Med. vol. 17. 2009.*
King, K. F. "Combining compressed sensing and parallel imaging." Proceedings of the 16th Annual Meeting of ISMRM, Toronto. vol. 1488. 2008.*
Sodickson and Manning, "Simultaneous Acquisition of Spatial Harmonics (SMASH): Fast Imaging With Radiofrequency Coil Arrays", MRM, vol. 38. (1997). pp. 591-603.
Richard G. Baraniuk, "Compressive Sensing" Lecture Notes, IEEE Signal Processing Magazine; Jul. (2007). pp. 118-124.
Beatty, King, Marinelli, Hardy and Lustig, "Sequential Application of Parallel Imaging and Compressed Sensing" Proc. Intl. Soc. Mag. Reson. Med. 17 (2009), p. 2824.

(Continued)

*Primary Examiner* — Melissa Koval
*Assistant Examiner* — Rishi Patel

(57) ABSTRACT

A method for generating a magnetic resonance image includes acquiring a first k-space data set from each of a plurality of RF coils. The first k-space data set includes calibration data and randomly undersampled data. For each RF coil, a fully randomly sampled k-space data set is generated by removing a portion of the calibration data. A compressed sensing reconstruction technique is applied to the fully randomly sampled k-space data set to generate an aliased image, which is used to generate a uniformly undersampled k-space data set. A second k-space data set is generated by inserting the portion of the calibration data and a parallel imaging reconstruction technique is applied to the second k-space data set to synthesize unacquired data. The second k-space data set and the synthesized data are combined to generate a complete k-space data set for the RF coil.

18 Claims, 4 Drawing Sheets

(56) References Cited

OTHER PUBLICATIONS

Beatty, Brau, Chang, Joshi, Michelich, Bayram, Nelson, Herfkens and Brittain, "A Method for Autocalibrating 2-D Accelerated Volumetric Parellel Imaging With Clinically Practical Reconstruction Times", Proc. Intl. Soc. Mag. Reson. Med. 15 (2007). p. 1749.

Beatty and Brau, "Uniform Virtual Coil Reconstruction for Autocalibrating Parallel Imaging", Proc. Intl. Soc. Mag. Reson. Med. 15 (2007). p. 1751.

Bernstein, Grgic, Brosnan and Pelc, "Reconstruction of Phase Contrast, Phased Array Multicoil Data", Magn Reson Med 32, (1994). pp. 330-334.

Brau, Beatty, Skare and Bammer, "Comparison of Reconstruction Accuracy and Efficiency Among Autocalibrating Data-Driven Parallel Imaging Methods", Magn Reson Med 59, (2008). pp. 382-395.

Candés, Romberg and Tao, "Robust Uncertainty Principles: Exact Signal Reconstruction From Highly Incomplete Frequency Information", IEEE Transactions on Information Theory, vol. 52, No. 2, Feb. (2006), pp. 489-509.

Chan and Plewes, "Halton Sequences for Adaptive 3D Radial Sampling", Sedona (2009).

David L. Donoho, "Compressed Sensing", IEEE Transactions on Information Theory, vol. 52, No. 4, Apr. 2006, pp. 1289-1306.

Tsaig and Donoho, "Extensions of Compressed Sensing", Oct. 22, 2004. www-stat.stanford.edu/~donoho/Reports/2004/ExtCS-10-22-04.pdf, pp. 1-20.

Dunbar and Humphreys, "A Spatial Data Structure for Fast Poisson-Disk Sample Generation", http://www.cs.virginia.edu/~gfx/pubs/antimony/ , proceedings of SIGGRAPH 2006.

Fischer, Seiberlich, Blaimer, Jakob, Breuer and Griswold, "A Combination of Nonconvex Compressed Sensing and Grappa (CS-GRAPPA)", Proc. Intl, Soc. Mag. Reson. Med. 17 (2009). p. 2813.

Griswold, Jakob, Heidemann, Nittka, Jellus, Wang Kiefer and Haase, "Generalized Autocalibrating Partially Parallel Acquistions (GRAPPA)", Magnetic Resonance in Medicine, vol. 47 (2002). pp. 1202-1210.

Liang, Liu, Wang and Ying, "Acclerating Sense Using Compressed Sensing", Magnetic Resonance in Medicine, vol. 62 (2009). pp. 1574-1584.

Liu, Sebert, Zou and Ying, "Sparsesense: Randomly-Sampled Parallel Imaging Using Compressed Sensing", Proc. Intl. Soc. Mag. Reson. Med. 16 (2008). p. 3154.

Lustig and Pauly, "Iterative GRAPPA: A General Solution for the Grappa Reconstruction From Arbitrary K-Space Sampling", Proc. Intl. Soc. Mag. Reson. Med. 15 (2007). p. 333.

Lustig, Alley, Vasanawala, Donoho and Pauly, "L1 SPIR-IT: Autocalibrating Parallel Imaging Compressed Sensing", Proc. Intl. Soc. Mag. Reson. Med. 17 (2009). p. 379.

Lustig, Donoho and Pauly, "Sparse MRI: The Application of Compressed Sensing for Rapid MR Imaging", Magnetic Resonance in Medicine, vol. 58. (2007). pp. 1182-1195.

Lustig, Alley, Vasanawala, Donoho and Pauly, "Autocalibrating Parallel Imaging Compressed Sensing Using L1 SPIR-IT With Poisson-Disc Sampling and Joint Sparsity Constraints", Sedona. (2009).

\* cited by examiner

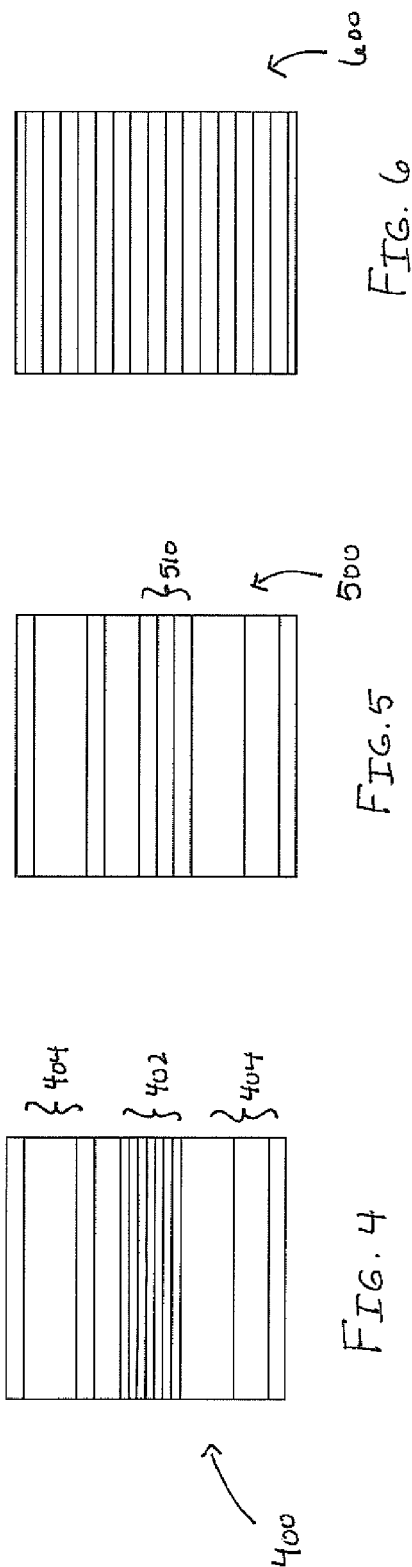

SYSTEM AND METHOD FOR GENERATING A MAGNETIC RESONANCE IMAGE USING COMPRESSED SENSING AND PARALLEL IMAGING

CROSS REFERENCE TO RELATED APPLICATION

The present application claims the benefit of U.S. Provisional Application Ser. No. 61/428,959, filed Dec. 31, 2010, herein incorporated by reference in its entirety.

TECHNICAL FIELD

The present invention relates generally to magnetic resonance imaging (MRI) systems and in particular, to a system and method for generating magnetic resonance images using compressed sensing and parallel imaging.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). A MRI system also comprises components called gradient coils that produce smaller amplitude, spatially varying magnetic fields when current is applied to them. Typically, gradient coils are designed to produce a magnetic field component that is aligned along the z axis and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

One technique that has been developed to accelerate MR data acquisition is commonly referred to as "parallel imaging" or "partial parallel imaging." In parallel imaging, multiple receive coils acquire data from a region or volume of interest, where the data is undersampled, for example, in a phase-encoding direction so that only a fraction of k-space data is acquired in an image scan. Thus, parallel imaging is used to accelerate data acquisition in one or more dimensions by exploiting the spatial dependence of phased array coil sensitivity. Parallel imaging has not only been shown to be successful in reducing scan time, but also reducing image blurring and geometric distortions. Moreover, parallel imaging can be used to improve spatial or temporal resolution as well as provide increased volumetric coverage.

There are several types of parallel imaging reconstruction methods that have been developed to generate the final, unaliased image from accelerated data. One such group of methods is data driven or autocalibrating techniques, such as Automatic Simultaneous Acquisition of Spatial Harmonics (AUTO-SMASH), Generalized Autocalibrating Partially Parallel Acquisition (GRAPPA), and Autocalibrating Reconstruction for Cartesian Sampling (ARC), among others. Such techniques calculate reconstruction weights necessary to synthesize unacquired data directly from acquired data in k-space using an algorithm that does not require coil sensitivity estimates. In such autocalibration based techniques, the reconstruction weights are calculated from a small amount of fully sampled calibration data that is typically embedded within the scan (i.e., "self-calibration" or "auto-calibration"), but can also be acquired before or after the scan.

More recently, another technique for accelerating MR data acquisition known as "compressed sensing" has been developed. Compressed sensing originates from the observation that most medical images have some degree of "compressibility." That is, when transformed into some suitable domain such as a wavelet domain, a substantial number of values can be set to zero (i.e., compressed) with little loss of image quality. In compressed sensing, compressed images are reconstructed using a non-linear reconstruction scheme, such as an L1-norm constraint, wherein the undersampled artifacts in the chosen domain must be sufficiently sparse (or incoherent) to effectively reconstruct the image. Like parallel imaging, compressed sensing has been found to reduce scan time, image blurring, and geometric distortions.

As both parallel imaging and compressed sensing enable accelerated MR data acquisition, there have been previous efforts to combine parallel imaging with compressed sensing. More specifically, efforts have been made to combine the two techniques by including the parallel imaging technique as a data consistency constraint in the compressed sensing reconstruction, thus resulting in a simultaneous implementation of the techniques. However, by incorporating parallel imaging as a data consistency constraint, the computational efficiency of the compressed sensing reconstruction is greatly reduced, thereby negating some of the benefits provided by using the parallel imaging or compressed sensing technique individually.

It would therefore be desirable to have a system and method that combines parallel imaging with compressed sensing that increases computational efficiency, so as to generate a high-quality reconstructed image while also reducing scan time.

BRIEF DESCRIPTION OF THE INVENTION

In accordance with an embodiment, a method for generating a magnetic resonance (MR) image includes acquiring a first k-space data set from each of a plurality of RF coils, the first k-space data set including calibration data in a center region of k-space and randomly undersampled data in an outer region of k-space, generating a fully randomly sampled k-space data set for each RF coil by removing a portion of the calibration data from the k-space data set, applying a compressed sensing reconstruction technique to the fully randomly sampled k-space data set of each RF coil to generate an aliased image for each RF coil, applying a Fourier transform to the aliased image of each RF coil to generate a uniformly undersampled k-space data set for each RF coil, generating a second k-space data set for each RF coil by inserting the portion of the calibration data, applying a parallel imaging reconstruction technique to the second k-space data set of each RF coil to synthesize unacquired data for each RF coil, combining the second k-space data set and the synthesized data for each RF coil to generate a complete k-space data set for each RF coil and generating a image based on the complete k-space data sets.

In accordance with another embodiment, a magnetic resonance imaging (MRI) system includes a resonance assembly comprising a plurality of gradient coils and a plurality of RF coils, an RF transceiver system coupled to the plurality of RF coils and configured to receive magnetic resonance (MR) data from the plurality of RF coils and a controller programmed to acquire a first k-space data set from each of the plurality of RF coils, the first k-space data set including calibration data in a center region of k-space and randomly undersampled data in an outer region of k-space, generate a fully randomly sampled k-space data set for each RF coil by removing a portion of the calibration data from the k-space data set, apply a compressed sensing reconstruction technique to the fully randomly sampled k-space data set of each RF coil to generate an aliased image for each RF coil, apply a Fourier transform to the aliased image of each RF coil to generate a uniformly undersampled k-space data set for each RF coil, generate a second k-space data set for each RF coil by inserting the portion of the calibration data, apply a parallel imaging reconstruction technique to the second k-space data set of each RF coil to synthesize unacquired data for each RF coil, combine the second k-space data set and the synthesized data for each RF coil to generate a complete k-space data set for each RF coil and generate a image based on the complete k-space data sets.

BRIEF DESCRIPTION OF THE DRAWINGS

Embodiments are illustrated by way of example and not limitation in the figures of the accompanying drawings, in which like reference numerals indicate corresponding, analogous or similar elements, and in which:

FIG. 4 illustrates an exemplary k-space sampling pattern in accordance with an embodiment;

FIG. 5 illustrates fully randomly sampled k-space data in accordance with an embodiment;

FIG. 6 illustrates uniformly undersampled k-space data in accordance with an embodiment;

FIG. 7 illustrates a k-space data set for use with a parallel imaging method in accordance with an embodiment; and FIG. 8 illustrates an exemplary complete k-space data set in accordance with an embodiment.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

Figure 1:
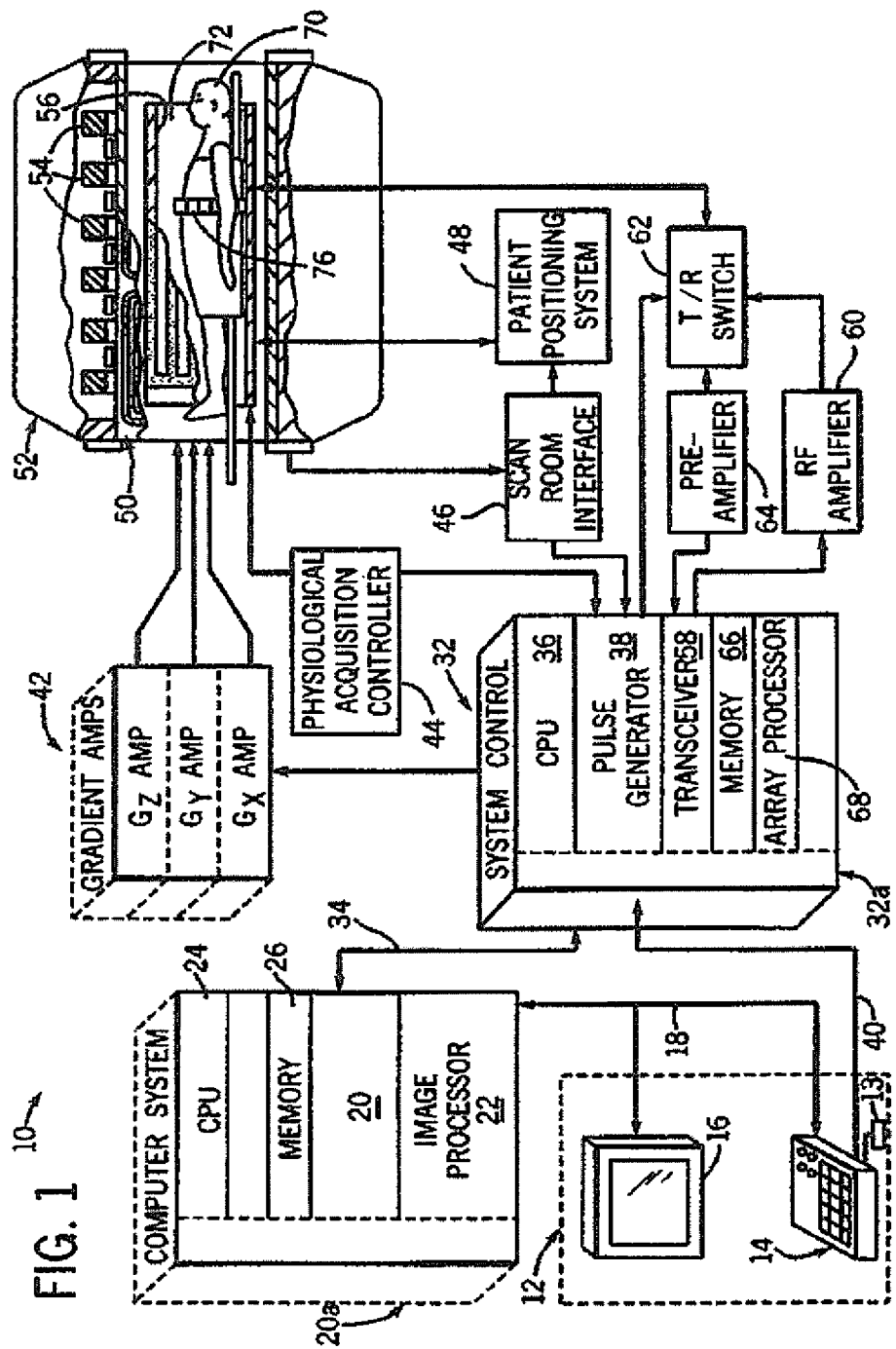
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14 and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links or may be fiber optic connections or wireless communication links or the like. The modules of computer system 20 may include an image processor module 22, a CPU module 24 and a memory module 26 that may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of an resonance assembly 52 that includes a superconducting magnet 54 and a whole-body RF coil 56, surface or parallel imaging coils 76 or both. The coils 56, 76 may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a parallel or surface coil 76) to be used in either the transmit or receive mode.

The MR signals sensed by the RF coil 56 or parallel or surface coils 76 are digitized by the transceiver module 58 and transferred to a memory module 66 in the system control computer 32. Typically, frames of data corresponding to MR signals are stored in the memory module 66 until they are subsequently transformed to create images. An array processor 68 uses a known transformation method, most commonly a Fourier transform, to create images from the MR signals. System control computer 32 (and/or computer 20) may also be configured to perform an image reconstruction process as described further below. The images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

As mentioned, the MRI system 10 may include parallel imaging coils 76. Such coils 76 may be used for a data driven or autocalibrated parallel imaging technique, which calculates reconstruction weights or unaliasing coefficients necessary to synthesize unacquired data directly from acquired data in k-space. In autocalibration based techniques, the weights or unaliasing coefficients are calculated from fully sampled calibration data that may be embedded within the scan, but can also be acquired before or after the scan. Parallel imaging coils 76 may be an array of RF receiver coil elements in which each RF receiver coil element separately detects MRI signals.

Figure 2:
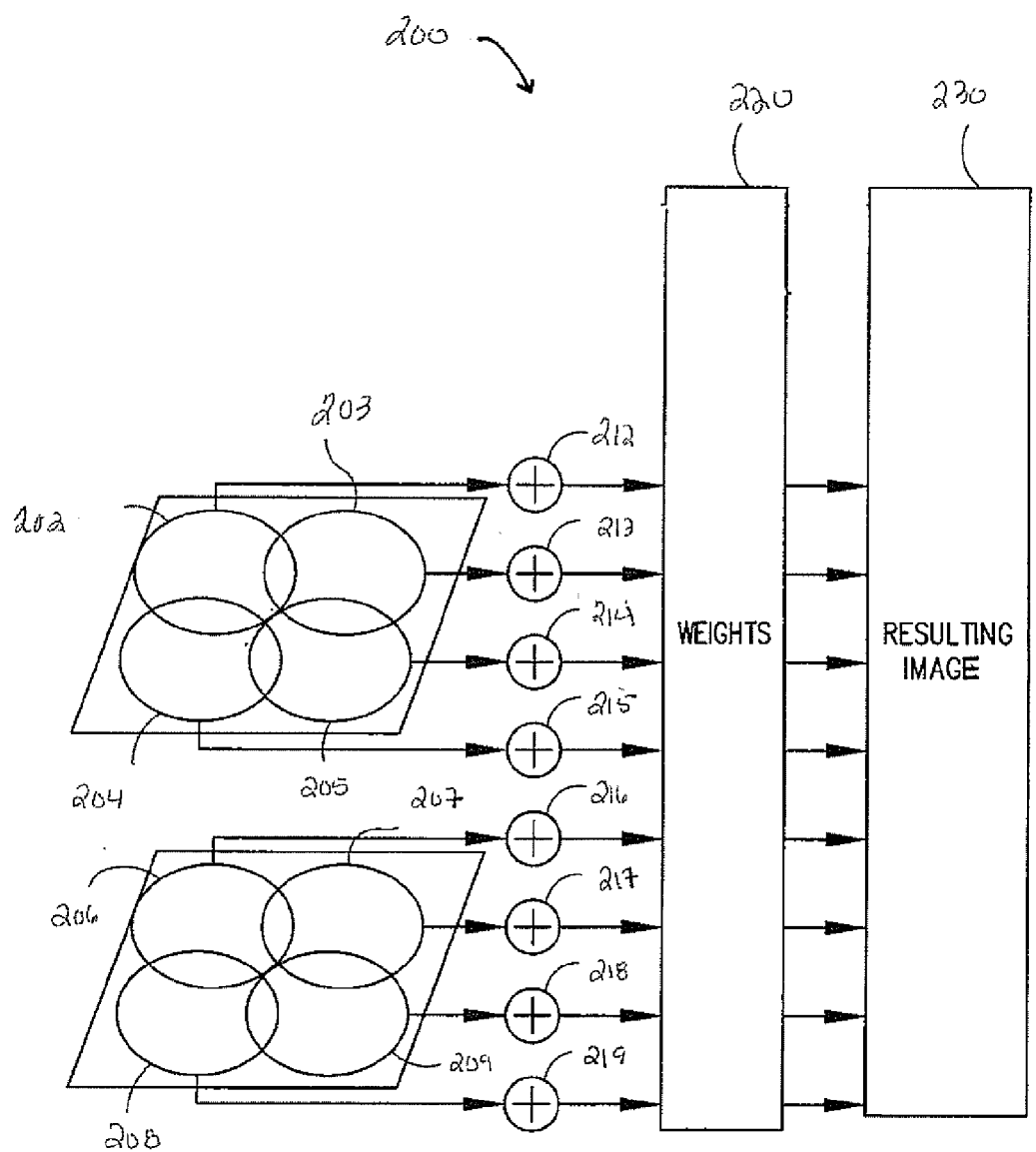
FIG. 2 is schematic block diagram of an exemplary RF coil array useful in an autocalibrating parallel imaging technique in accordance with an embodiment.

FIG. 2 is a schematic block diagram of an exemplary RF coil array useful in an autocalibrating parallel imaging technique in accordance with an embodiment. RF coil array 200 is used to acquire imaging data for a field of view (FOV) and includes eight separate coil elements 202-209 (i.e., receiver coils). It is contemplated, however, that the coil array 200 may include more or less than eight coil elements. One skilled in the art will appreciate that the array illustrated in FIG. 2 is exemplary and many other receiver coil geometries may be used in accordance with embodiments. Each coil element 202-209 samples the FOV by detecting changes in excited nuclei in the FOV and transmits signals indicative of that which is detected to separate data acquisition channels 212-219, respectively. Typically, the scan is an overall undersampled acquisition with a small region that is fully sampled (i.e., calibration data). Calibration data (e.g., fully sampled data from a region of k-space) from each channel 212-219 is used to generate synthesis (or reconstruction) weights or unaliasing coefficients 220. The reconstruction weights of coefficients 220 allow the unacquired data for undersampled regions of k-space to be synthesized from the acquired data in k-space. The acquired and synthesized data may be used to generate an image or images 230.

Figure 3:
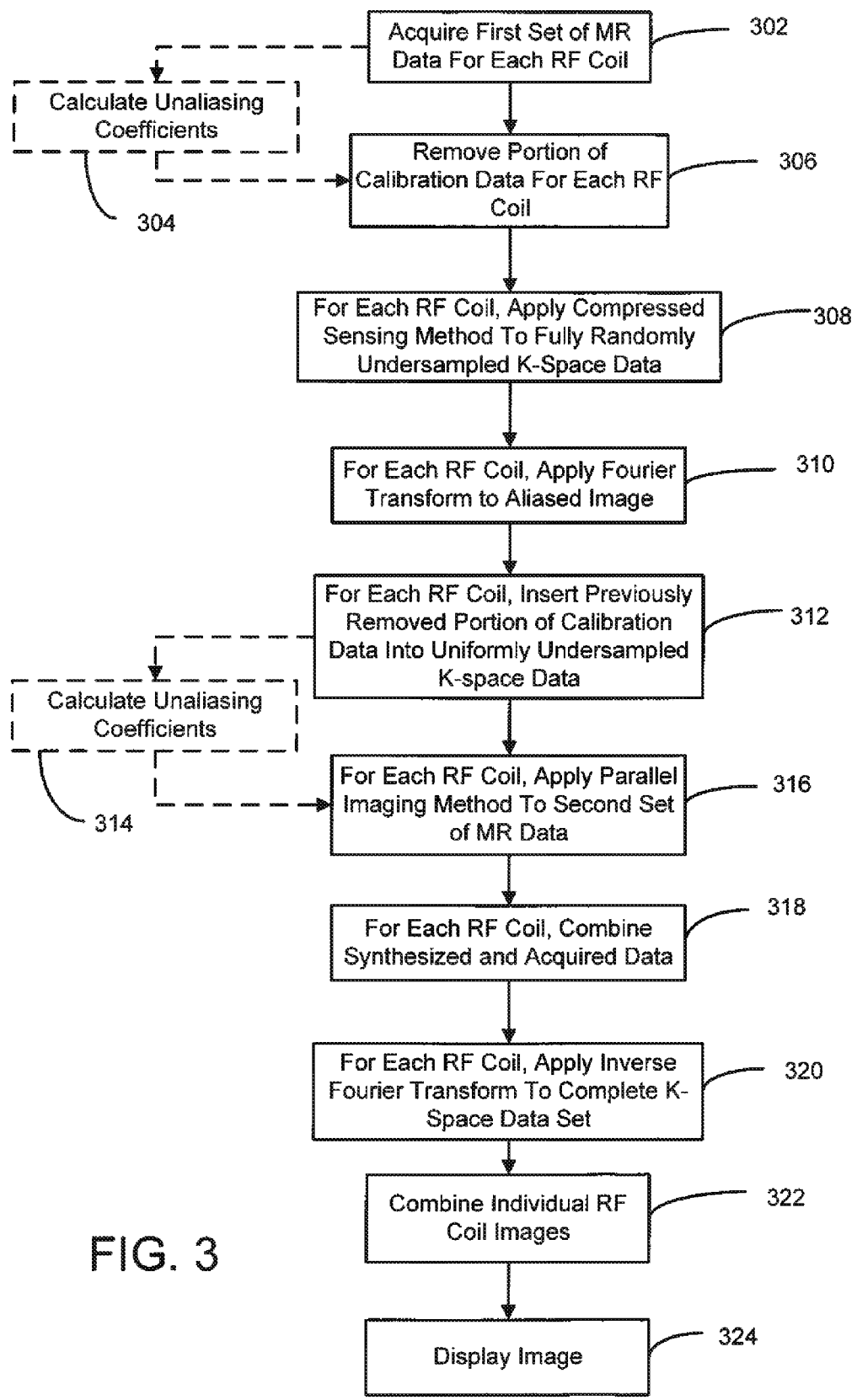
FIG. 3 illustrates a method for generating a magnetic resonance (MR) image using a combination of compressed sensing and parallel imaging in accordance with an embodiment.

FIG. 3 illustrates a method for generating a magnetic resonance (MR) image using a combination of compressed sensing and parallel imaging in accordance with an embodiment. At block 302, a pulse sequence is played out and a first set of MR data is acquired using each RF coil in a plurality of RF coils, such as RF coil array 200 shown in FIG. 2, in an MRI system, such as system 10 shown in FIG. 1. The MR data is acquired using a k-space undersampling pattern 400 shown in FIG. 4 that has Nyquist sampling in a center region 402 of k-space to collect calibration data (or autocalibration signals "ACS"). The calibration data is used to calculate unaliasing coefficients (or reconstruction kernels) for the parallel imaging method. An outer region 404 of k-space has a random undersampling to accelerate the acquisition. At block 304, the unaliasing coefficients for each RF coil may be determined according to the parallel imaging method being used and stored in, for example, a storage of the MRI system. In an alternative embodiment, the unaliasing coefficients (or reconstruction kernels) for each RF coil can be determined at block 314 as described below. Preferably, the parallel imaging method is a data driven (or autocalibrating) parallel imaging technique such as, for example, ARC.

At block 306 a portion of the calibration data (or Nyquist sampling area) for each RF coil is discarded or removed from the center of k-space 510 to generate a fully randomly undersampled k-space data set 500 as shown in FIG. 5 for each RF coil. The remaining k-space samples represent a random undersampling of a uniformly sampled k-space 500. This random undersampling of data is used with a compressed sensing method. At block 308 a compressed sensing method is applied to the fully randomly undersampled k-space 500 for each RF coil to reconstruct an aliased image for each RF coil. Any compressed sensing method known in the art may be used in accordance with embodiments. The aliased image generated for each RF coil corresponds to a uniformly undersampled k-space data set. At block 310, a Fourier transform is applied to the aliased image for each RF coil to generate a uniformly undersampled k-space data set 600, as shown in FIG. 6, for each RF coil.

At block 312, for each RF coil the portion of the calibration data that was removed at block 306, as described above, is inserted back into the uniformly undersampled k-space data 600 resulting in a second set of MR (or k-space) data 700, shown in FIG. 7, for each RF coil. The MR data set 700 for each RF coil includes a fully (or Nyquist) sampled center region 720 of k-space (the calibration data) and a uniformly undersampled outer region 722. As mentioned above, in an embodiment, the unaliasing coefficients (reconstruction kernels) for each RF coil for the parallel imaging technique may be calculated using the calibration data 720 and stored at block 314 rather than at block 304 above. At block 316, the parallel imaging method (e.g., ARC) is then applied to the k-space data set 700 for each RF coil to synthesize and fill in the unacquired (or unmeasured) k-space data for each RF coil. For example, the unaliasing coefficients (or reconstruction kernels) may be applied to the k-space data set 700 of block 312 for each RF coil to synthesize the unacquired data for each RF coil. At block 318, for each RF coil the synthesized data is then combined with the acquired k-space data resulting in a complete fully-sampled k-space data set 800 as shown in FIG. 8 for each RF coil. At block 320, an inverse Fourier transform is applied to the complete k-space data set for each RF coil to generate a coil image for each RF coil. The individual coil images of the RF coils can then be combined at block 322 to generate (or reconstruct) a final image. The coil images may be combined using known reconstruction techniques such as a sum of squares technique. At block 324, the final image may be displayed on, for example, a display 16 of the MR system as shown in FIG. 1.

Computer-executable instructions for generating a magnetic resonance image according to the above-described method may be stored on a form of computer readable media. Computer readable media includes volatile and nonvolatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

A technical effect of the disclosed method and apparatus is that it provides for a computer-implemented technique for generating a magnetic resonance image by combing compressed sensing and parallel imaging reconstruction techniques.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A method for generating a magnetic resonance (MR) image, the method comprising:
    acquiring a first k-space data set from each of a plurality of RF coils, the first k-space data set including calibration data in a center region of k-space and randomly undersampled data in an outer region of k-space;
    generating a fully randomly sampled k-space data set for each RF coil by removing a portion of the calibration data from the k-space data set;
    applying a compressed sensing reconstruction technique to the fully randomly sampled k-space data set of each RF coil to generate an aliased image for each RF coil;
    applying a Fourier transform to the aliased image of each RF coil to generate a uniformly undersampled k-space data set for each RF coil;
    generating a second k-space data set for each RF coil by inserting the portion of the calibration data;
    applying a parallel imaging reconstruction technique to the second k-space data set of each RF coil to synthesize unacquired data for each RF coil;
    combining the second k-space data set and the synthesized data for each RF coil to generate a complete k-space data set for each RF coil; and
    generating an image based on the complete k-space data sets.

2. A method according to claim 1, further comprising after acquiring the first k-space data set, generating a set of unaliasing coefficients based on the calibration data.

3. A method according to claim 2, wherein the parallel imaging reconstruction technique includes applying the unaliasing coefficients to the second k-space data set to synthesize the unacquired data.

4. A method according to claim 1, wherein the parallel imaging reconstruction technique is a data driven parallel imaging technique.

5. A method according to claim 1, further comprising after generating the second k-space data set, generating a set of unaliasing coefficients based on the calibration data.

6. A method according to claim 5, wherein the parallel imaging reconstruction technique includes applying the unaliasing coefficients to the second k-space data set to synthesize the unacquired data.

7. A method according to claim 1, wherein generating an image comprises generating a coil image for each RF coil based on the complete k-space data set for the associated RF coil and generating a final image based on the coil images for each RF coil.

8. A method according to claim 7, wherein the final image is generated using a sum-of-squares technique.

9. A method according to claim 7, wherein each coil image is generated by applying an inverse Fourier transform to the complete k-space data set for the associated RF coil.

10. A magnetic resonance imaging (MRI) system comprising:
    a resonance assembly comprising a plurality of gradient coils and a plurality of RF coils;
    an RF transceiver system coupled to the plurality of RF coils and configured to receive magnetic resonance (MR) data from the plurality of RF coils; and
    a controller programmed to:
        acquire a first k-space data set from each of the plurality of RF coils, the first k-space data set including calibration data in a center region of k-space and randomly undersampled data in an outer region of k-space;
        generate a fully randomly sampled k-space data set for each RF coil by removing a portion of the calibration data from the k-space data set;
        apply a compressed sensing reconstruction technique to the fully randomly sampled k-space data set of each RF coil to generate an aliased image for each RF coil;
        apply a Fourier transform to the aliased image of each RF coil to generate a uniformly undersampled k-space data set for each RF coil;
        generate a second k-space data set for each RF coil by inserting the portion of the calibration data;

apply a parallel imaging reconstruction technique to the second k-space data set of each RF coil to synthesize unacquired data for each RF coil;

combine the second k-space data set and the synthesized data for each RF coil to generate a complete k-space data set for each RF coil; and generate an image based on the complete k-space data sets.

11. A MRI system according to claim 10, wherein the controller is further programmed to, after acquiring the first k-space data set, generate a set of unaliasing coefficients based on the calibration data.

12. A MRI system according to claim 11, wherein the parallel imaging reconstruction technique includes applying the unaliasing coefficients to the second k-space data set to synthesize the unacquired data.

13. A MRI system according to claim 10, wherein the parallel imaging reconstruction technique is a data driven parallel imaging technique.

14. A MRI system according to claim 10, wherein the controller is further programmed to, after generating the second k-space data set, generate a set of unaliasing coefficients based on the calibration data.

15. An MRI system according to claim 14, wherein the parallel imaging reconstruction technique includes applying the unaliasing coefficients to the second k-space data set to synthesize the unacquired data.

16. A MRI system according to claim 10, wherein generating an image comprises generating a coil image for each RF coil based on the complete k-space data set for the associated RF coil and generating a final image based on the coil images for each RF coil.

17. A MRI system according to claim 16, wherein the final image is generated using a sum-of-squares technique.

18. A MRI system according to claim 16, wherein each coil image is generated by applying an inverse Fourier transform to the complete k-space data set for the associated RF coil.

* * * * *